(12) United States Patent
Hwang et al.

(10) Patent No.: US 7,662,723 B2
(45) Date of Patent: Feb. 16, 2010

(54) METHODS AND APPARATUS FOR IN-SITU SUBSTRATE PROCESSING

(75) Inventors: Guang-Yaw Hwang, Hsin-Shi (TW); Pu-Lun Lui, Hsin-Shi (TW); Yu-Wei Yang, Hsin-Shi (TW)

(73) Assignee: Lam Research Corporation, Fremont, CA (US)

( * ) Notice: Subject to any disclaimer, the term of this patent is extended or adjusted under 35 U.S.C. 154(b) by 53 days.

(21) Appl. No.: 11/608,738

(22) Filed: Dec. 8, 2006

(65) Prior Publication Data

US 2007/0175861 A1    Aug. 2, 2007

(51) Int. Cl.
*H01L 21/302* (2006.01)
(52) U.S. Cl. .................. 438/725; 438/714; 156/345.34
(58) Field of Classification Search ................ 438/706, 438/710, 712, 714, 720, 725; 156/345.33, 156/34
See application file for complete search history.

(56) References Cited

U.S. PATENT DOCUMENTS

| | | | |
|---|---|---|---|
| 6,207,583 B1 * | 3/2001 | Dunne et al. ................ 438/725 |
| 6,670,276 B1 * | 12/2003 | Suemasa et al. ............ 438/706 |
| 7,396,480 B2 * | 7/2008 | Kao et al. .................... 216/58 |
| 2004/0192058 A1 * | 9/2004 | Chu et al. ................... 438/710 |
| 2005/0215051 A1 * | 9/2005 | Yang et al. .................. 438/624 |
| 2005/0241766 A1 * | 11/2005 | Dhindsa et al. ........ 156/345.34 |
| 2005/0269293 A1 * | 12/2005 | Fan et al. ...................... 216/67 |
| 2006/0199370 A1 * | 9/2006 | Dai et al. .................... 438/624 |

* cited by examiner

*Primary Examiner*—Lan Vinh
(74) *Attorney, Agent, or Firm*—IP Strategy Group, P.C.

(57) ABSTRACT

A plasma processing system for processing a substrate is disclosed. The plasma processing system includes a gas distribution system. The plasma processing system also includes a gas flow control assembly coupled to the gas distribution system and configured to control a set of input gases provided by the gas distribution system. The plasma processing system further includes a first set of nozzles coupled to the gas flow control assembly and configured to supply a first set of gases for processing a first portion of the substrate. The plasma processing system further includes a second set of nozzles coupled to the gas flow control assembly and configured to supply a second set of gases for processing a second portion of the substrate.

15 Claims, 8 Drawing Sheets

METHODS AND APPARATUS FOR IN-SITU SUBSTRATE PROCESSING

BACKGROUND OF THE INVENTION

In the processing of a substrate, e.g., a semiconductor substrate or a glass panel such as one utilized in flat panel display manufacturing, plasma is often employed. As part of the processing of a substrate, for example, the substrate is divided into a plurality of dies, or rectangular areas, each of which will become an integrated circuit. The substrate is then processed in a series of steps in which materials are selectively removed (etching) and/or deposited (deposition) in order to form electrical components thereon.

In an example plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Figure 1:
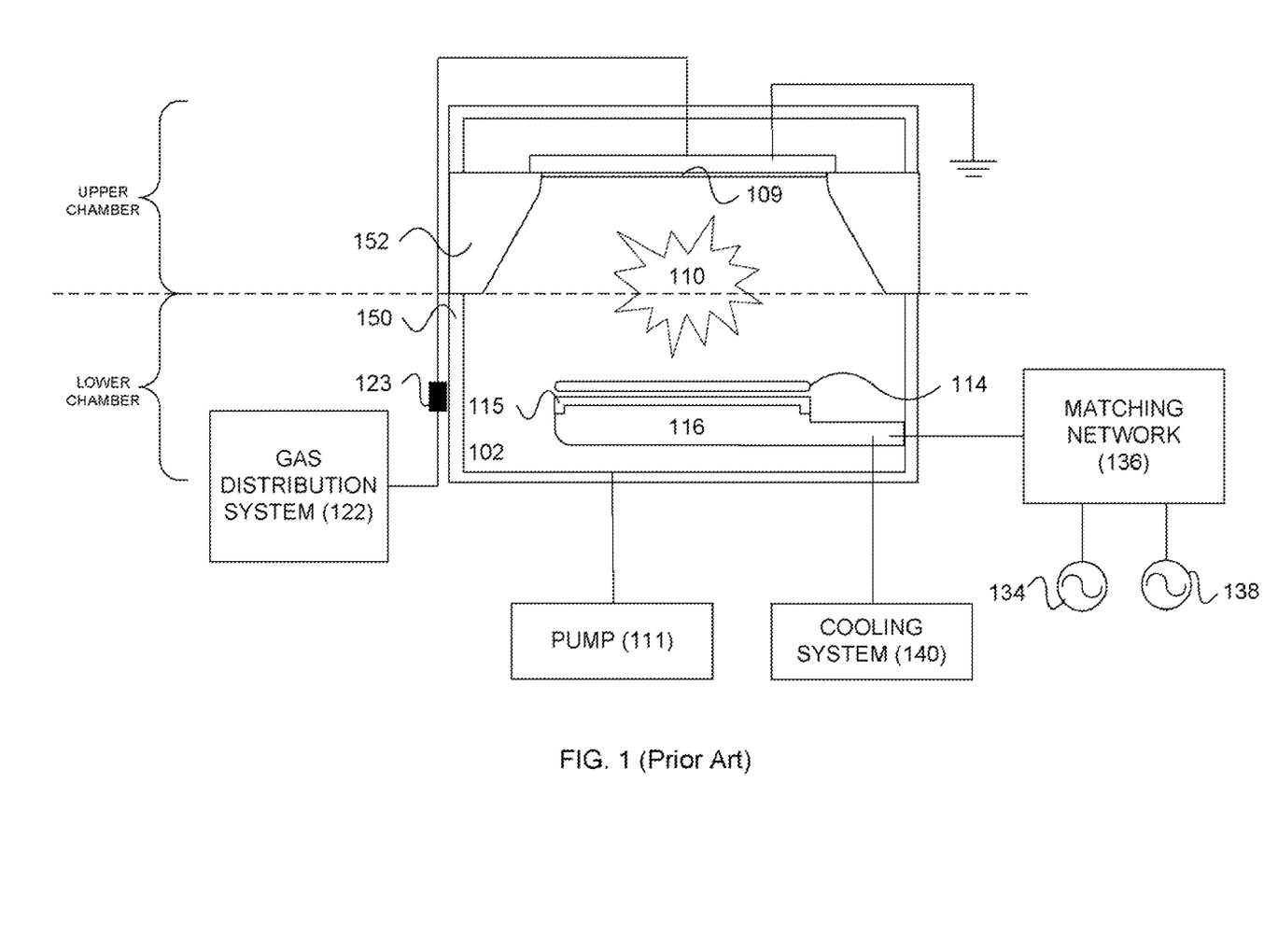
FIG. 1 shows a simplified diagram of a capacitively coupled plasma processing system.

Referring now to FIG. 1, a simplified diagram of a capacitively coupled plasma processing system is shown. In a common configuration, the plasma processing chamber may comprise a bottom piece 150 located in the lower chamber, and a detachable top piece 152 located in the upper chamber. A first RF generator 134 (source RF generator 134) generates a plasma 110 as well as controls the plasma density, while a second RF generator 138 (bias RF generator) that generates bias RF is commonly utilized to control the DC bias and the ion bombardment energy.

Further coupled to source RF generator 134 and bias RF generator 138 may be a matching network 136 that attempts to match the impedances of the RF power sources to that of plasma 110. Furthermore, a pump 111 is commonly utilized to evacuate the ambient atmosphere from a plasma processing chamber 102 (formed by the bottom piece 150 and the detachable top piece 152) in order to achieve the required pressure to sustain plasma 110.

Generally, an appropriate set of gases (input gases) is flowed into chamber 102 through showerhead/grounded electrode 109 from gas distribution system 122 to shut off valve 123 located in the lower chamber. In general, in order to achieve a substantially uniform enchant gas distribution across the surface of a substrate, a showerhead/grounded electrode 109, with a perforated or porous planar surface, is generally utilized. Gas distribution system 122 commonly comprises compressed gas cylinders containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc). These plasma gases may be subsequently ionized to form plasma 110, in order to process (e.g., etch or deposit) exposed areas of substrate 114, such as a semiconductor substrate or a glass pane, positioned with edge ring 115 on an electrostatic chuck 116, which also serves as a powered electrode.

In addition, some type of cooling system 140 may be coupled to the chuck in order to achieve thermal equilibrium once the plasma is ignited. Cooling system 140 usually comprises a chiller that pumps a coolant through cavities in within the chuck, and helium gas pressurizes the small gap between chuck 116 and substrate 114. In addition to removing the generated heat, the helium gas also allows cooling system 140 to rapidly control heat dissipation. That is, increasing helium pressure subsequently also increases the heat transfer rate. Most plasma processing systems are also controlled by sophisticated computers comprising software programs. In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole. Generally, an opening is formed in a dielectric layer, usually lined with a barrier material (e.g., SiCN, SiC, SiON, $Si_3N_4$, etc.), and then subsequently filled with a conductive material (e.g., aluminum (Al), copper (Cu), etc.) that allows electrical contact between two sets of conductive patterns, thereby establishing electrical contact between two active regions on the substrate, such as a source/drain region. Excess conductive material on the surface of the dielectric layer is typically removed by chemical mechanical polishing (CMP). A blanket layer of silicon nitride is then deposited to cap the copper.

There are generally two commonly utilized approaches for manufacturing dual damascene substrates: via-first and trench-first. In one example of the via-first methodology, the substrate is first coated with photoresist, and then the vias are lithographically patterned. Next, an anisotropic etch cuts through the surface cap material, etches down through the low-k layer of the substrate, and stops on the barrier material, just above the underlying metal layer. Next, the via photoresist layer is stripped, the trench photoresist applied, and lithographically patterned. Typically, some of the photoresist may remain in the bottom of the via, or the via may be covered by an organic ARC plug, in order to prevent the lower portion via from being over-etched during the trench etch process. A second anisotropic etch then cuts through the surface cap material and etches the low-k material down to a desired depth. The second anisotropic etch forms the trench. The photoresist is then stripped, and the barrier material at the bottom of the via is opened with a very soft, low-energy etch that will not cause the underlying copper to sputter into the via. As described above, the trench and via are filled with a conductive material (e.g., aluminum (Al), Copper (Cu), etc.) and polished by chemical mechanical polishing (CMP).

An alternate methodology is trench-first. In one example, the substrate is coated with photoresist, and a trench lithographic pattern is applied. An anisotropic dry etch then cuts through a surface hard mask (e.g., SiCN, SiC, SiON, $Si_3N_4$, etc.) followed by stripping the photoresist. Another photoresist is applied over a trench hard mask, and then the vias are lithographically patterned. A second anisotropic etch then cuts through a cap layer and partially etches down into the low-k material. The second anisotropic etch forms partial vias. The photoresist is then stripped for trench etch over the vias with the trench hard mask. The trench etch then cuts through the cap layer and partially etches the low-k material down to desired depth. The second anisotropic etch also clears via holes at the same time, stopping on the final barrier material located at the bottom of the via. The final barrier material may then be opened with a special etch.

Figure 2:
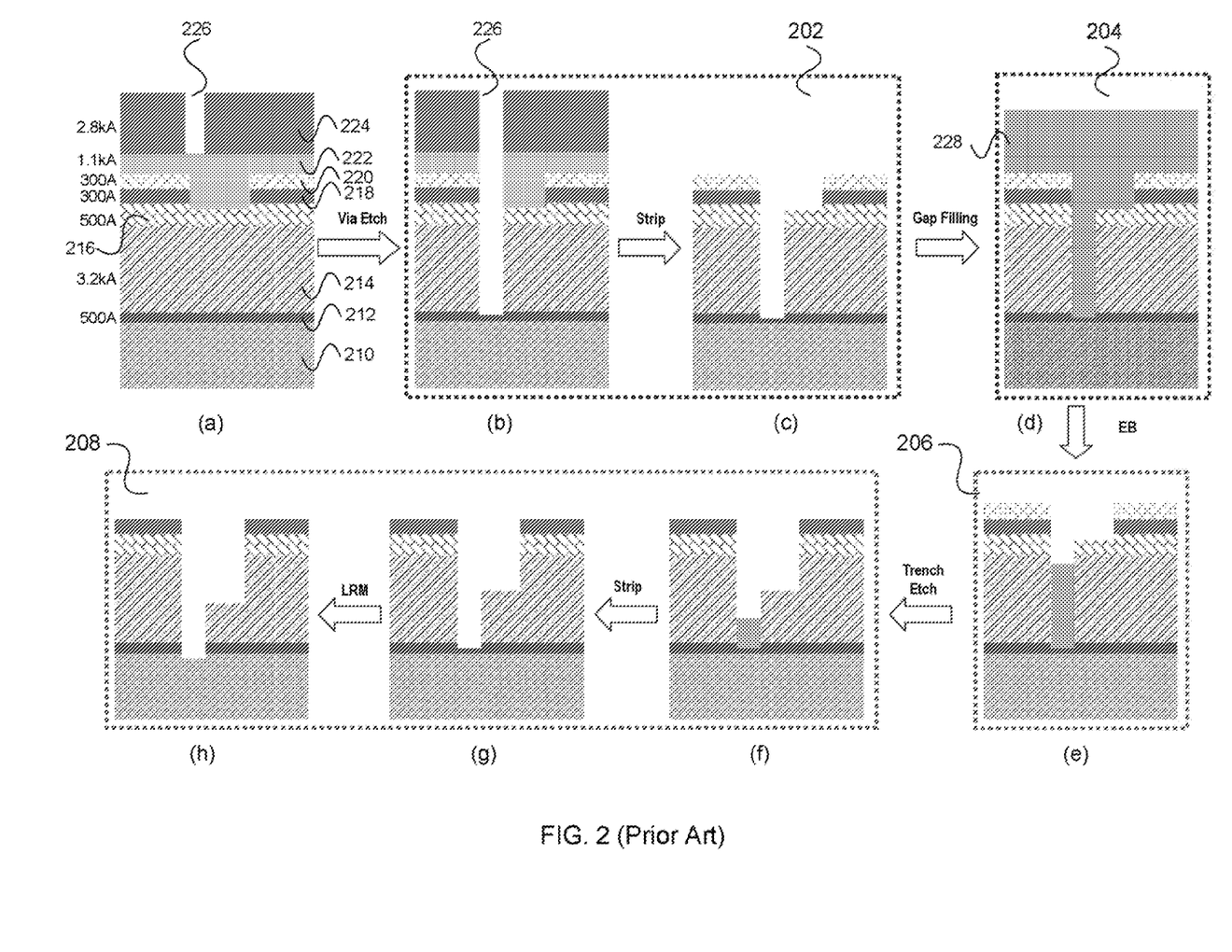
FIG. 2 shows a partial simplified set of example prior-art dual-damascene process steps, in which an idealized cross-sectional view of the layer stack is shown.

For example, a common via-first process generally may involve alternating between etch and deposition processes, performed on different plasma processing systems. To facilitate discussion, FIG. 2 illustrates a partially simplified set of example prior-art dual-damascene process steps, in which an idealized cross-sectional view of a layer stack is shown. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

A partially etched substrate is shown at step (a). At the bottom of the layer stack, there is shown a metal layer 210, commonly aluminum or copper. Above the first metal layer is commonly metal barrier layer 212 (e.g., SiCN, SiC, SiON, $Si_3N_4$, etc.) that is commonly about 500 Å in thickness. Metal barrier layer 212 generally provides an etch stop when etching a low-k material immediately above. Above the metal barrier layer 212, there may be disposed an intermediate dielectric (IMD) layer 214 formed of a low-k material, e.g., one of SiCN, SiOC, BLACK DIAMOND™ supplied by Applied Materials, Inc. (www.appliedmaterials.com), CORAL™ supplied by Novellus Systems, inc. (www.novellus.com), TEOS, etc., that is commonly about 3.2 k Å in thickness. Above the IMD layer 214, there may be placed a cap layer 216 (e.g., SiCN, SiOC, BLACK DIAMOND™, CORAL™, TEOS, etc.) that is commonly about 500 Å in thickness. Above cap layer 216, there may be disposed a trench mask layer 218 (e.g., TiN, SiN, TaN, etc.) that is commonly about 300 Å. Above trench mask layer 218 may be another barrier layer 220 (e.g. PEOX, etc.) that is commonly about 300 Å. Above barrier layer 220 may be a BARC layer 222 that is commonly about 1.1 k Å. Finally above BARC layer 222 is photoresist layer 224, patterned with via 226, and is commonly about 2.8 k Å in thickness.

The substrate is transferred to a plasma processing etch chamber 202 (e.g., Lam Research 2300 Exelan™, etc.). At step (b), via 226 is etched down to metal barrier layer 212. At step (c), photoresist layer 224 and BARC layer 222 are removed (stripped). The substrate is then transferred to a cleaning chamber (not shown) and then to a photoresist deposition chamber 204. In general, the substrate must be cleaned when transported transport between manufacturing stations.

During the etch process, it is not uncommon for polymer byproducts to form on the top and bottom of a substrate. In general, polymers that form on the substrate during the etch process are organic and may be composed of Carbon (C), oxygen (O), Nitrogen (N), and/or Fluorine (F). However, as successive polymer layers are deposited as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield. Hence, it is advantageous to minimize the number of times a substrate must be transported.

In general, the substrates are chemically cleaned using a combination of wet and dry processes. Wet processes generally involve placing the substrate in a tank (e.g., quartz, plastic, etc.) or on a spinning turntable, with a combination of solvents and acids (e.g., $H_2SO_4$, $H_2O_2$, $NH_4OH$, HF, etc.) in order to remove organic and inorganic contaminant residues, respectively, and is usually followed by deionized (DI) water rinse and spine dry processes. Frequently, megasonics is utilized to enhance the cleaning efficiency of wet cleaning processes. Megasonics refers to a transducer mounted in the bottom of the tank that generates high power acoustic energy waves. This additional energy generally aids in removing particles from the substrate surface. Common examples of substrate spin process platforms with megasonic functionality include products supplied by SEZ Holding Ltd. (www.sez.com), Akrion, inc. (www.akrion.com), and Semitool, inc. (www.semitool.com).

For example, a common cleaning method called SC-1 (Standard Clean Solution #1) includes placing the substrate in a tank (e.g., quartz, plastic, etc.) or on a spinning turntable with a mixture of ammonium hydroxide ($NH_4OH$), hydrogen peroxide ($H_2O_2$) and DI water ($H_2O$). A typical concentration ratio for the mix is 1:1:5 for $NH_4OH:H_2O_2:H_2O$, although recently ratios as low as 0.05:1:5 have been utilized for better cleaning performance. SC-1 may be effective at removing organic contaminants from the surface of the substrate by continually oxidizing and then etching the surface of the substrate, thereby dissolving the contaminants into solution. It is typically operated in the temperature range of 50-70° C.

Another commonly utilized cleaning method called SC-2 (Standard Clean Solution #2) includes placing the substrate in a quartz or plastic tank with a mixture of hydrochloric acid (HCl), hydrogen peroxide ($H_2O_2$), and DI water ($H_2O$). A typical concentration ratio for the mix is 1:1:5 for $HCl:H_2O_2:H_2O$. In general, SC-2 solution is optimized for removing metal contaminants from the substrate surface, and usually follows the SC-1. Like the SC-1, it removes metals by continually oxidizing and then etching the surface of the wafer, thereby dissolving the contaminants into solution. It is typically operated in the temperature range of 50-70° C.

In addition, dry cleaning methods are also utilized. In general, dry cleaning is the process of removing contaminants from the substrate surface in the gas-phase. Removal of contaminants may be driven by either conversion of contaminant into volatile compound through chemical reaction, "knocking" the contaminant off the substrate surface via momentum transfer, or lift-off of the contaminant during slight etching of contaminated surface.

After the substrate is cleaned, it is transported to photoresist deposition chamber 204. In general, the substrate is placed on a spindle with a vacuum chuck that can hold the substrate during a high-speed rotation. Liquid photoresist is applied on the substrate surface, and the centrifugal force from the substrate rotation spreads the liquid over the whole substrate. The photoresist thickness is related to both viscosity and spin rate. That is, the greater the viscosity, the thicker the photoresist layer, whereas the greater the spin rate, the thinner the photoresist layer. The photoresist layer is then baked and exposed to UV radiation in order to convert it into a tough adhesive film over the surface of the substrate.

The substrate is then transferred to another plasma processing etch chamber 206. Generally, the photoresist is partially etched, leaving only a portion in via 226 to prepare the substrate for the subsequently metal barrier layer 212 etch. In a process commonly known as PREB (photoresist etch back), and $O_2$ chemistry is commonly utilized in order to etch the photoresist back to a particular level. Here, that level is a point between the top and bottom of the via. Consequently, in order to prevent all of the photoresist from being removed, as would commonly be the case after a typical etch procedure is completed, the photoresist removal process must generally be attenuated.

One method of attenuating $O_2$ chemistry, and hence controlling etch rate, may be the addition of a substantial amount of inert gases to the gas mixture. That is, as the volume of inert gas, such as argon, increases in the plasma processing chamber, a greater number of oxygen ions may collide and exchange energy with the inert gas molecules, absorbing thermal energy away from the substrate surface and hence reducing the photoresist etch rate.

Another method of attenuating $O_2$ chemistry may be to pre-coat the plasma processing chamber with a material that has an affinity to the etchant in order to reduce the effective amount of etchant radicals in the plasma, and thus optimize the photoresist etch rate. For example, pre-coating the chamber with $Cl_2$ may reduce the effective amount of oxygen radicals in the plasma that are available to etch the photoresist. In general, the greater the amount of pre-coat material, the fewer the number of available oxygen radicals available to the etching process.

However, the plasma processing chamber utilized for PREB may not be optimized for multiple consecutive process steps (e.g., PREB, trench etch, photoresist strip, etc.) that may require different process chemistries and chamber conditions. For example, in a typical etch chamber, it may be difficult to optimize the distribution of $O_2$ in combination with the inert gases, across the surface of the substrate. However, as the plasma etches away the photoresist, areas on the substrate with a higher topography take longer to etch than areas with lower topography, creating non-uniform photo resist profiles among the trenches or vias as the case may be. In addition, the outer edge of the substrate may collect more electrons than the center (hence increasing the corresponding etch rate) since the edge is closer to the plasma potential. Hence it may be advantageous to asymmetrically distribute $O_2$ across the surface of the substrate to insure a substantially uniform etch rate.

In addition, it is important to maintain substantially clean chamber conditions to minimize chamber memory effects and to maintain repeatable results between successive substrates. Since fully removing PREB contaminant deposits may be time consuming in many plasma processing systems, the plasma processing chamber is generally cleaned only when particle contamination levels reach unacceptable levels. However, it is often difficult to determine exactly when process conditions change beyond established parameters. There is generally no effective way to determine if a plasma process has moved outside of established parameters in-situ, without first initially processing and then subsequently testing partially manufacturing substrates. That is, after a batch of substrates has been processed, a sample substrate is removed from the batch and tested. Hence, in order to maximize the length of time between required cleanings, a dedicated plasma processing chamber is often preferred for a PREB process. Often, in order to maximize capital investment, older machines may be dedicated to specific tasks or processes, such as PREB.

After the PREB process is completed, the substrate may again be cleaned (not shown) as previously described, then transported to a plasma etch chamber 208 where barrier layer 220 (e.g. PEOX, etc.) may be removed, and metal barrier layer 212 may be etched. Initially, at step (f), barrier layer 220 is removed. In general, the remaining photoresist 228 after the previous PREB step shields metal barrier layer 212 from the plasma as barrier 220 is removed. That is, a portion of photoresist 228 is etched instead of metal barrier layer 212 etched. Next, in step (g), the remaining photoresist is removed (stripped) as previously described. Finally, metal barrier layer 212 is etched. In general, a liner removal process (LRM) may be utilized to etch metal barrier layer 212.

However, it is often advantageous in the processing of a substrate to combine as many steps as processing during a single processing session (i.e., in-situ) in order to minimize the handling of each substrate, and hence to improve yield, to improve the overall production throughput, to help minimize the amount of plasma processing chambers required, and to minimize substrate defects caused during substrate transport.

SUMMARY

An embodiment of the present invention relates to a plasma processing system for processing a substrate. The plasma processing system may include a gas distribution system. The plasma processing system may also include a gas flow control assembly coupled to the gas distribution system and configured to control a set of input gases provided by the gas distribution system. The plasma processing system may further include a first set of nozzles coupled to the gas flow control assembly and configured to supply a first set of gases for processing a first portion of the substrate. The plasma processing system may further include a second set of nozzles coupled to the gas flow control assembly and configured to supply a second set of gases for processing a second portion of the substrate. The first set of gases may represent a first portion of the set of input gases, and the second set of gases may represent a second portion of the set of input gases. A flow rate of the first set of gases may be different from a flow rate of the second set of gases.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventors herein that a PREB processing step may be combined with a metal layer barrier etch processing step in an enhanced a plasma processing chamber. In an embodiment, the enhanced plasma processing chamber may be part of the Lam Research 2300 Exelan™ Flex plasma processing system supplied by Lam Research Corporation (www.lamrc.com).

As previously described, PREB processing generally uses attenuated $O_2$ chemistry in order to etch the photoresist back to a particular level. For example, a substantial amount of inert gases may be added to the gas mixture in order to reduce the etch rate. In addition, the plasma processing chamber may be pre-coated with a material that has an affinity to the etchant in order to reduce the effective amount of etchant radicals in the plasma, and thus optimize the etch rate. For example, pre-coating the chamber with a material to which oxygen has an affinity, such as $Cl_2$, will reduce the effective amount of oxygen radicals in the plasma that are available to etch the photoresist. In general, the greater the amount of pre-coat material, the fewer the number of available oxygen radicals available to the etching process. Conventionally, a dedicated plasma processing chamber may generally be utilized because of contamination or process control concerns.

In an advantageous manner, an enhanced plasma processing system may be configured with at least one of a top electrode temperature control system and differential plasma gas injection in order to both attenuate the $O_2$ etch process and to minimize contamination.

In an embodiment, the enhanced plasma processing system may execute a waferless auto clean process in order to substantially remove PREB contaminants, allowing process conditions to remain within established parameters during successive processing steps of a substrate. In addition, since the enhanced plasma processing system substantially removes most of the PREB contaminants, the required time between chamber cleanings is substantially maintained or improved.

One or more embodiments of the present invention involve a plasma processing system for processing a substrate. The plasma processing system may include a gas distribution system (i.e. a gas supply). The plasma processing system may also include a gas flow control assembly coupled to the gas distribution system and configured to control a set of input gases supplied by the gas distribution system. The set of input gases includes at least one gas. The plasma processing system may further include a first set of nozzles coupled to the gas flow control assembly and configured to supply a first set of gases for processing a first portion of the substrate. The first set of gases may represent a first portion of the set of input gases. The plasma processing system may further include a second set of nozzles coupled to the gas flow control assembly and configured to supply a second set of gases for processing a second portion of the substrate. The second set of gases may represent a second portion of the set of input gases. A flow rate of the first set of gases may be different from a flow rate of the second set of gases.

In one or more embodiments, the first portion of the substrate may represent a center zone of the substrate, the second portion of the substrate may represent an edge zone of the substrate, and the flow rate of the first set of gases may be higher than the flow rate of the second set of gases.

In one or more embodiments, the plasma processing system may further include a temperature control system coupled to an upper chamber of the plasma processing system. The temperature control system including a heating unit configured to heat an electrode disposed inside the upper chamber.

With the electrode being heated during processing the substrate, the amount of contaminants (e.g., polymer byproducts) that attach to the substrate, the electrode, and walls of the plasma processing chamber may be effectively reduced, and therefore the amount of contaminants that are evacuated by a pump may be effectively increased. Accordingly, contamination of substrates positioned under the substrate may be reduced, and therefore time, efforts, and costs associated with cleaning substrates may be reduced. Further, contamination of the electrode may be reduced, and therefore the frequency of replacing or cleaning electrodes and associated costs may be reduced. The electrode may represent a showerhead. Further, contamination of the plasma processing chamber may be reduced, and therefore the substrate may be processed with more process steps in the same plasma processing chamber without being moved to a different plasma processing chamber. Advantageously, productivity and efficiency may be improved, and costs may be reduced in processing substrates.

One or more embodiments of the present invention involve a method for processing a substrate that includes a barrier layer and deposited photoresist. The method may include supplying and ionizing a first set of gases to partially etch the deposited photoresist at a first portion of the substrate in a plasma processing chamber. The method may also include supplying and ionizing a second set of gases to partially etch the deposited photoresist at a second portion of the substrate in the plasma processing chamber. The method may further include removing the barrier layer in the same plasma processing chamber.

In one or more embodiments, the method may further include heating an electrode of the plasma processing system. The electrode may represent a showerhead for delivering at least one of the first set of gases and the second set of gases into the plasma processing chamber.

One or more embodiments of the present invention involve a method for processing a substrate in a plasma processing system. The method includes heating an electrode of the plasma processing system to reduce a processing rate of the substrate.

The features and advantages of the present invention may be better understood with reference to the figures and discussions that follow.

Figure 3:
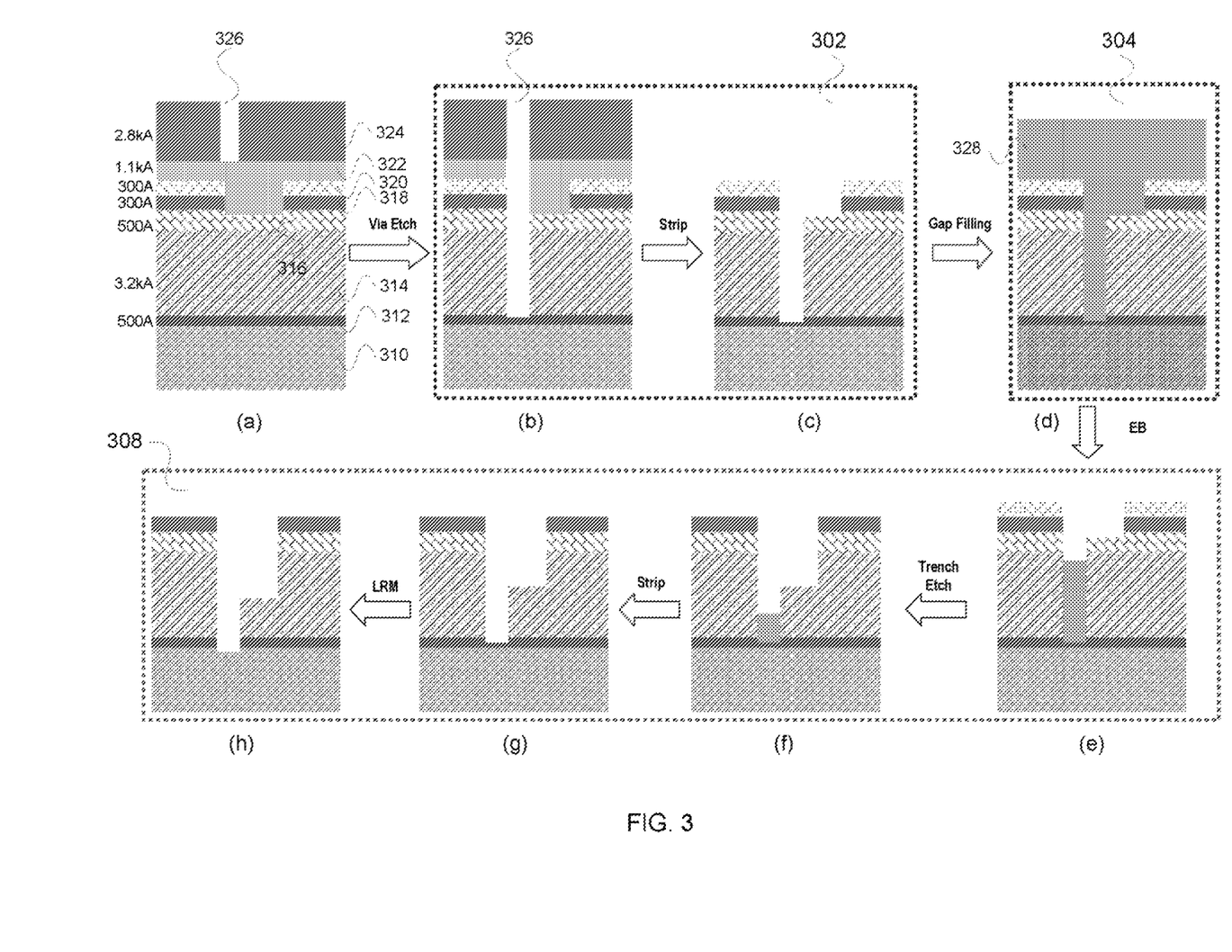
FIG. 3 shows a partial simplified set of dual-damascene process steps in which a PREB processing step has been combined with a metal layer barrier etch processing step in an enhanced plasma processing chamber, according to one or more embodiments of the invention.

Referring now to FIG. 3, a partial simplified set of dual-damascene process steps is shown, in which a PREB processing step has been combined with a metal layer barrier etch processing step in an enhanced plasma processing chamber, according to one or more embodiments of the invention.

A partially etched substrate is shown at step (a). At the bottom of the layer stack, there is shown a metal layer 310, commonly aluminum or copper. Above the first metal layer is commonly metal barrier layer 312 (e.g., SiCN, SiC, SiON, $Si_3N_4$, etc.) that is commonly about 500 Å in thickness. Above the metal barrier layer 312, there may be disposed an intermediate dielectric (IMD) layer 314 that is formed of a material comprising a low-k material (e.g., SiCN, SiOC, BLACK DIAMOND™, CORAL™, TEOS, etc.) and is commonly about 3.2 k Å in thickness. Above the IMD layer 314, there may be placed a cap layer 316 (e.g., SiCN, SiOC, BLACK DIAMOND™, CORAL™, TEOS, etc.) that is commonly about 500 Å in thickness. Above cap layer 316, there may be disposed a trench mask layer 318 (e.g., TiN, SiN, TaN, etc.) that is commonly about 300 Å. Above trench mask layer 318 may be another barrier layer 320 (e.g. PEOX, etc.) that is commonly about 300 Å. Above barrier layer 320 may be a BARC layer 322 that is commonly about 1.1 k Å. Finally above BARC layer 322 may be photoresist layer 324, patterned with via 326, and is commonly about 2.8 k Å in thickness.

The substrate is transferred to a plasma processing etch chamber 302 (e.g., Lam Research 2300 EXELAN™, etc. supplied by Lam Research Corporation). At step (b), via 326 is etched down to metal barrier layer 312. At step (c), photoresist layer 324 and BARC layer 322 are removed. The substrate is then transferred to a cleaning chamber (not shown) and then to a photoresist deposition chamber 304. The substrate may be cleaned when being transported between manufacturing stations. In general, the substrates may be chemically cleaned using one or more of wet and dry processes (e.g., SC-1, SC-2, megasonics, dry cleaning, etc.) or a combination thereof. After the substrate is cleaned, it is transported to photoresist deposition chamber 304.

However, unlike prior-art methods, the substrate may then be transferred to an enhanced plasma processing chamber 308 in order to execute both the PREB processing step at step (e) and the metal layer barrier etch processing step at step (f), without an additional cleaning step before step (f). At step (e), the PREB process, photoresist 328 is partially removed, leaving only a portion in via 326 in order to prepare the substrate for the subsequently metal barrier layer 312. In one or more embodiments, at step (e), enhanced plasma processing chamber 308 is heated such that a substantial amount of contaminants (e.g., polymer byproducts) produced at step (e) are evacuated by a pump coupled to plasma processing chamber 308 without contaminating plasma processing chamber 308. Accordingly, plasma processing chamber 308 may be in a desirable condition for step (f), and the substrate may not need to be transferred to a different plasma processing chamber. After the PREB process is completed, barrier layer 320 is removed at step (f) in the same enhanced plasma processing chamber 308. Next, in step (g), the remaining photoresist is removed as previously described. Finally, metal barrier layer 312 is etched at step (h).

Figure 4:
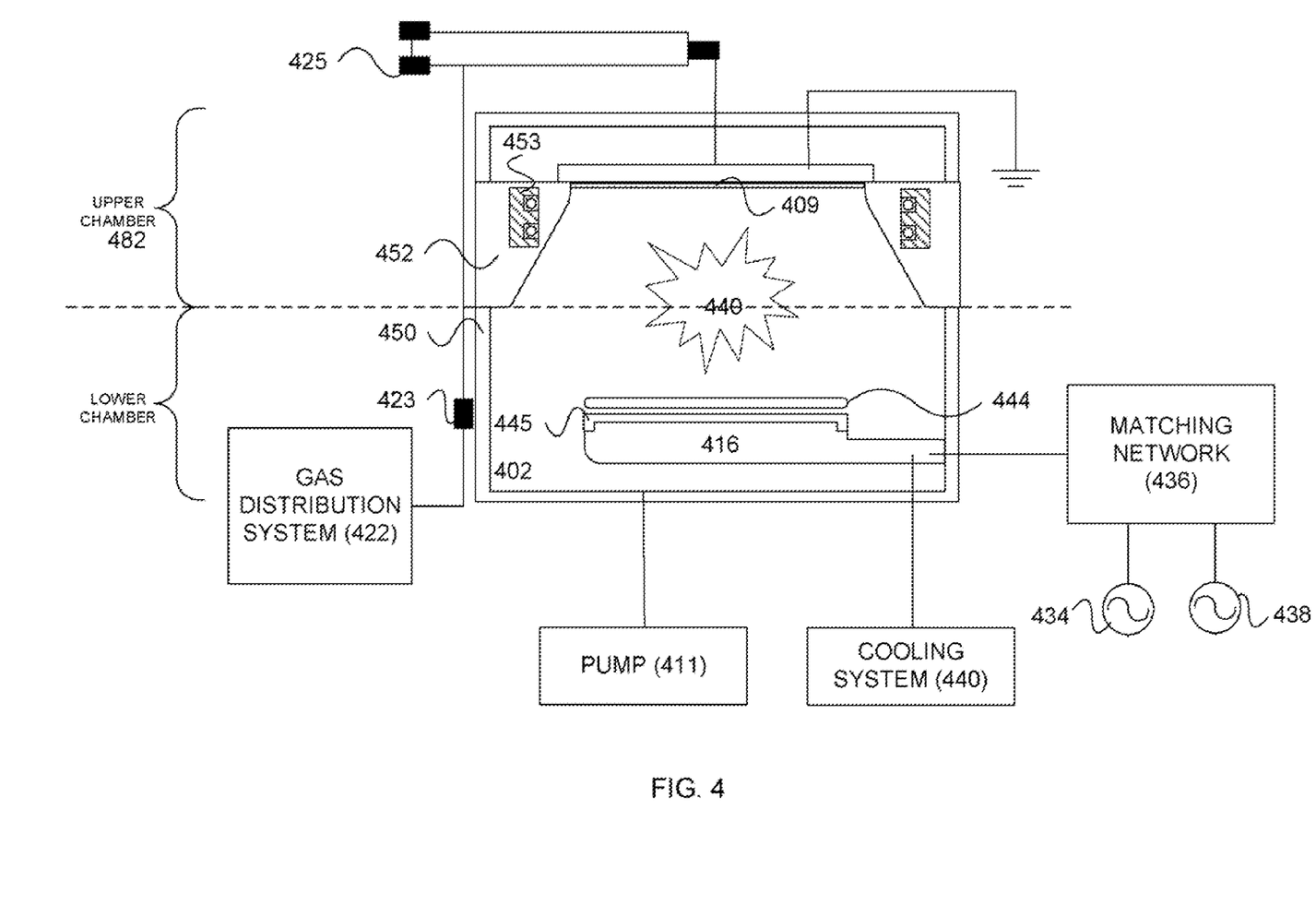
FIG. 4 shows a simplified diagram of an enhanced capacitively coupled plasma processing system with a top electrode temperature control system and differential plasma gas injection, according to one or more embodiments of the invention.

Referring now to FIG. 4, a simplified diagram of an enhanced capacitively coupled plasma processing system with a top electrode temperature control system and differential plasma gas injection is shown, according to one or more embodiments of the invention. The enhanced plasma processing chamber may comprise a bottom piece 450 located in the lower chamber, and a detachable top piece 452 and a temperature control system 453 at least partially located in top piece 452.

In one or more embodiments, temperature control system 453 may include a heating unit and a cooling unit (or a heating and cooling unit) and may be coupled to an upper chamber 482 of the plasma processing system. The heating and cooling unit may serve to transport heat into or away from upper chamber 282 through the same thermal interface. In one or more embodiments, temperature control system 453 may include a heating and cooling unit that is coupled via a latching mechanism to an outer surface of upper chamber 482. In one or more embodiments, the latching mechanism may include a clamp assembly. In one or more embodiments, the clamp assembly is integrated directly into the heating and cooling unit.

In one or more embodiments, a first RF generator 434 (source RF generator 434) generates the plasma as well as controls the plasma density, while a second RF generator 438 (bias RF generator 438) generates bias RF and is commonly utilized to control the DC bias and the ion bombardment energy. A matching network 436 may be coupled to source RF generator 434 and to bias RF generator 438 and may be configured to match the impedances of the RF power sources to that of plasma 440. Furthermore, pump 411 may be utilized to evacuate the ambient atmosphere from plasma processing chamber 402 in order to achieve the required pressure to sustain plasma 440. Pump 411 also may be configured to evacuate contaminants from plasma processing chamber 402.

In one or more embodiments, an appropriate set of gases is flowed into chamber 402 from gas distribution system 422 to shut off valve 423 located in the lower chamber. Unlike commonly configured plasma processing chambers, showerhead/grounded electrode 409 may comprise different sets of zones of independently controlled nozzles (e.g., in order to optimize the substrate uniformity). Showerhead/grounded electrode 409 may be connected to gas flow control assembly 425, which may be located near upper chamber 482 and which may be coupled to shut off valve 423.

In one or more embodiments, the zones on a multi-zone showerhead/grounded electrode comprise a center set of nozzles principally introducing a first set of plasma gases (process gases) into the center of the plasma for etching a first zone (e.g., center zone) of substrate 444, and an edge set of nozzles principally injecting a second set of plasma gases (process gases) into the remaining part of the plasma for etching a second zone (e.g., edge zone) of substrate 444. Advantageously, the flow rates of the first set of plasma gases and the second set of plasma gases may be controlled such that substrate 444 may be etched in a uniform manner. The flow rates may be different. In one or more embodiments, the flow rate of the first set of plasma gases may be higher than the flow rate of the second set of plasma gases.

In one or more embodiments, gas flow control assembly 425, comprising one or more of stainless steel conduits, valves, bypasses, and flow restrictions, provides the necessary gas flow adjustments at showerhead/grounded electrode 409. These plasma gases may be subsequently ionized to form a plasma 440, in order to process (e.g., etch or deposition) exposed areas of substrate 444, such as a semiconductor substrate or a glass pane, positioned with edge ring 445 on an electrostatic chuck 416, which also serves as a powered electrode.

One or more of the first set of plasma gases and the second set of plasma gases may include one or more of oxygen and inert gas. In an advantageous manner, heating the top electrode (showerhead/grounded electrode 409) may excite the plasma gases, increasing the number of collisions between oxygen ions and inert gas molecules potentially reducing the photoresist etch rate. Alternatively or additionally, referring to FIG. 4, heating showerhead/grounded electrode 409 may reduce the amount of contaminants that attach to one or more of substrate 444, showerhead/grounded electrode 409, top piece 452, bottom piece 450, and electrostatic chuck 416. Accordingly, a substantial amount of contaminants may be evacuated from plasma processing chamber 402 by pump 411.

Figure 5:
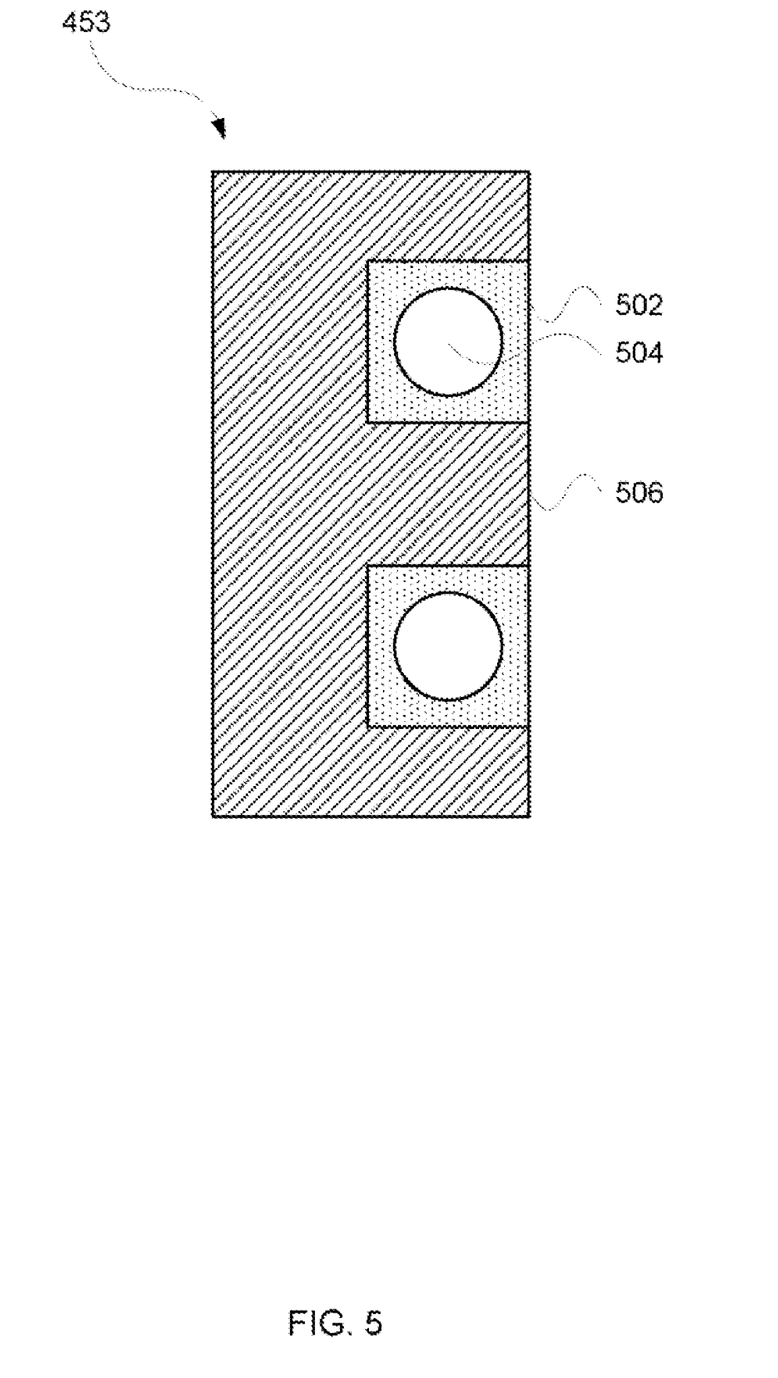
FIG. 5 shows a simplified cross-sectional view of the temperature control system of FIG. 4, according to one or more embodiments of the invention.

Referring now to FIG. 5, a simplified cross-sectional view of temperature control system 453 of FIG. 4 is shown, according to one or more embodiments of the invention. A cooling channel 502 is formed in thermally conductive body 506 to house cooling conduit 504. Cooling channel 502 is a single circuitous channel having a path that doubles back on itself in order to average thermal loads over thermal body 506. In this manner, warping of thermally conductive body 506 may be reduced. Cooling conduit 504 may carry a fluidic medium selected to efficiently conduct thermal energy away from upper chamber. Any number of cooling fluids may be utilized in accordance with the present invention. In one embodiment, water is utilized as the fluidic medium. Cooling conduit 504 may be attached with thermally conductive body 506 in any of a number of manners known in the art. In some embodiments, where more efficient cooling is required cooling conduit 504 may be secured in the cooling channel 502 with a thermally conductive material such as a polymer resin for example.

Figure 6:
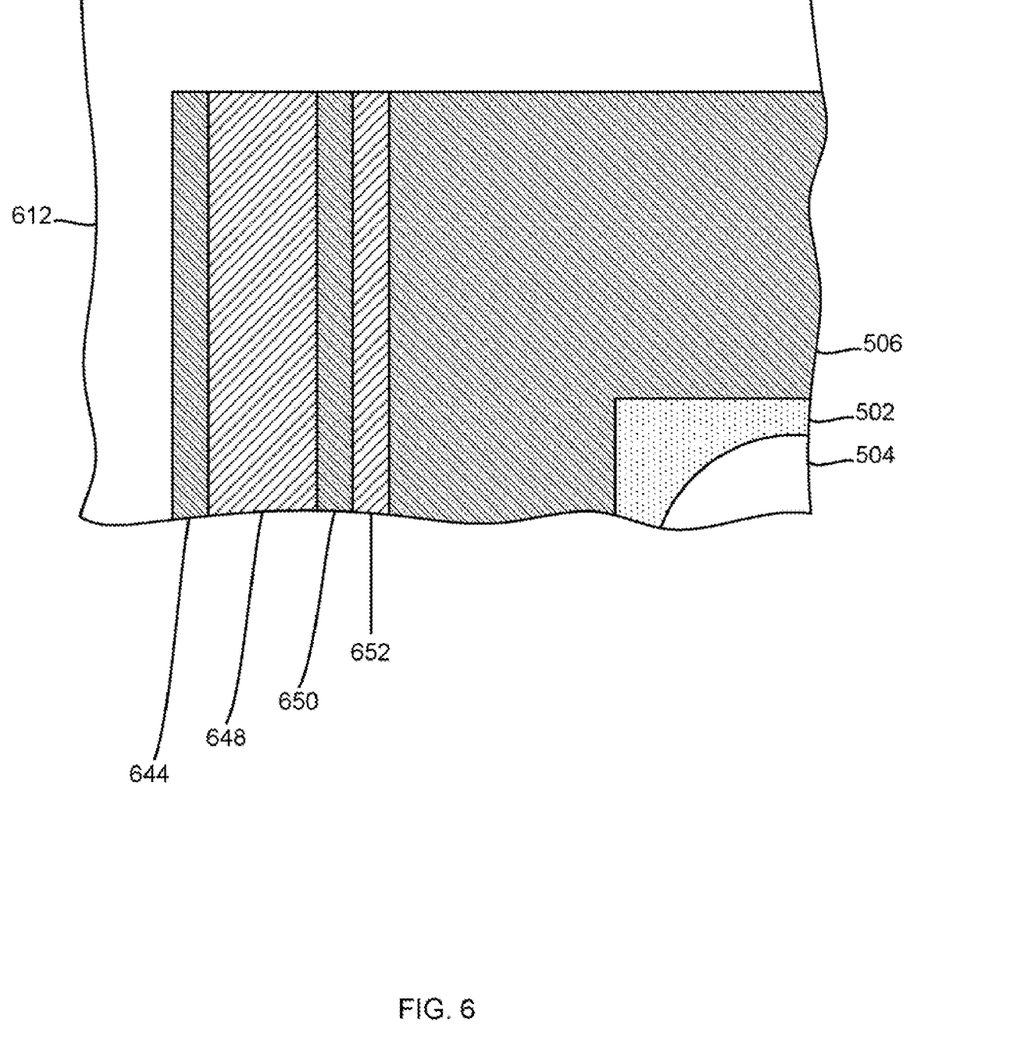
FIG. 6 shows a partial magnified cross-sectional representation of the temperature control system of FIG. 5, according to one or more embodiments of the invention.

Referring now to FIG. 6, a partial magnified cross-sectional representation of temperature control system 453 of FIG. 5 is shown, according to one or more embodiments of the invention. In one or more embodiments of the present invention, a thermally conductive material 644 comprises one or more thermal interface layer. Thermally conductive material 644 may be utilized to improve the metal to metal contact between surfaces—in this example, between an upper chamber sidewall 612 and a dissipation band 648. In one or more embodiments, thermally conductive material 644 may include a thermal pad. In one or more embodiments, thermally conductive material 644 may include thermal grease. Dissipation band 648 may comprise one or more thermal interface layers. In general, dissipation band 648 functions to distribute thermal loads evenly over the surface of thermally conductive body 506. The dissipation of thermal loads by dissipation band 648 differs from conduction of thermal loads by thermally conductive material 644 in that dissipation is substantially radial with respect to interface layer surfaces whereas conduction is substantially perpendicular with respect to interface layer surfaces. Dissipation band 648 may be formed of material chosen from any of a number of suitable thermally dissipative materials well-known in the art. In one or more embodiments, dissipation band 648 is made of series 6000 aluminum.

A heater layer 650 also may comprise one or more thermal interface layers. In one embodiment, heater layer 650 may be a KAPTON® etched foil heater. The capacity of the heater is selected based upon the process demand parameters. Thermal barrier layer 652 also may comprise one or more thermal interface layers. A final layer (not shown) may be bonded to an outer surface of the thermally conductive body 506. This final layer, in some embodiments, is a thermal arrestor. A thermal arrestor may insulate a thermal control device from ambient temperature changes thus resulting in better process control of the device. Each of the layers discussed may be bonded to each other using any thermally conductive adhesive well known in the art. In some embodiments, double sided thermal adhesive tape such as THERMATTACH® T412 from Chomerics (www.chomerics.com, a division of Parker Hannifin Corporation) may be utilized. Those skilled in the art will recognize that the layers illustrated may not be scale representations of actual embodiments. Rather, the layers are for illustrative purposes only. Material selection and design constraints will dictate layer sizing.

Figure 7:
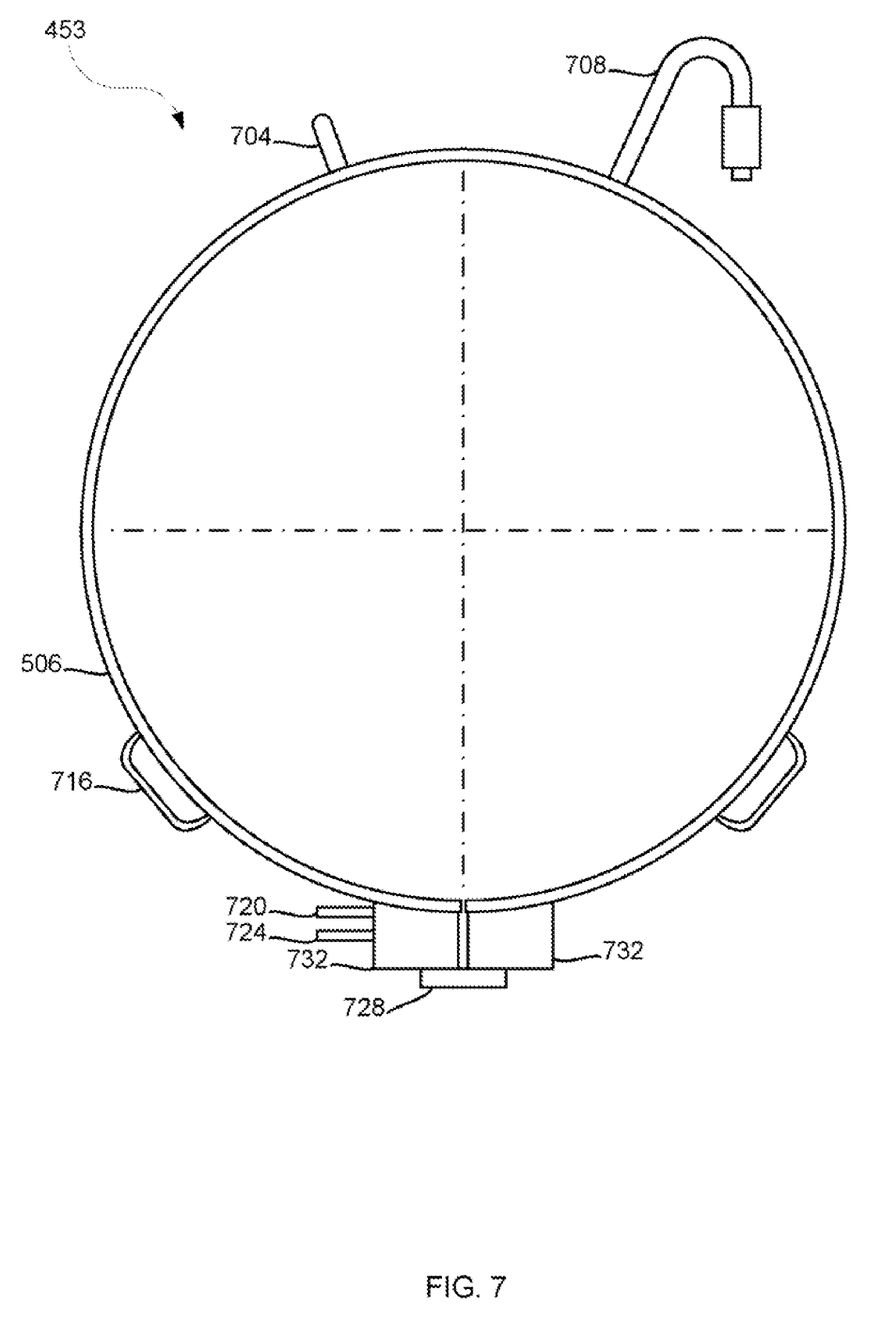
FIG. 7 shows an illustrative top view representation of a temperature control device, according to one or more embodiments of the present invention.

Referring to FIG. 7, an illustrative top view representation of temperature control device 453 is shown, according to one or more embodiments of the present invention. In one or more embodiments of the present invention, control device 453 may be characterized by its circular configuration. Mounting blocks 732 may be attached with each end of thermally conductive body 506. Mounting blocks 732 may serve multiple functions. First, mounting blocks 732 may serve as attachment points for a clamping system 728 to secure temperature control device 453 to an upper chamber of a plasma processing apparatus. Clamping may be accomplished in any manner commonly known in the art.

In one or more embodiments, mounting blocks 732 may serve as attachment points for one or more of an inlet 720 and an outlet 724 of cooling conduit 502 (shown in FIG. 5). At least one inlet 720 and one outlet 724 may be mounted on either of mounting blocks 732. Any number of suitable fittings well known in the art may be utilized as attachment points for the cooling conduit. Handles 716 may be provided to assist in the handling of temperature control device 453. Handles 716 may be thermally isolated from temperature control device 453 so as to reduce or eliminate thermal noise in the system. Additional handles may be added as required without departing from the present invention. A temperature sensing device is shown at 704. Temperature sensing device 704 may be utilized to interlock a plasma control system in the event of an over-temperature condition. In one embodiment, a resistance temperature detector (RTD) may be utilized to sense temperature. A heater attachment point 708 may be connected with thermally conductive body 506. Heater attachment point 708 may provide stress relief for heater layer and convenient access to the heater embedded in temperature control device 453. Ideally, heater attachment point 708 is thermally isolated from temperature control device 453 so as not to introduce thermal noise into the system.

Benefits of heating the top electrode include increasing the number of collisions between oxygen ions and inert gas molecules in order to potentially reduce the photoresist etch rate.

Figure 8:
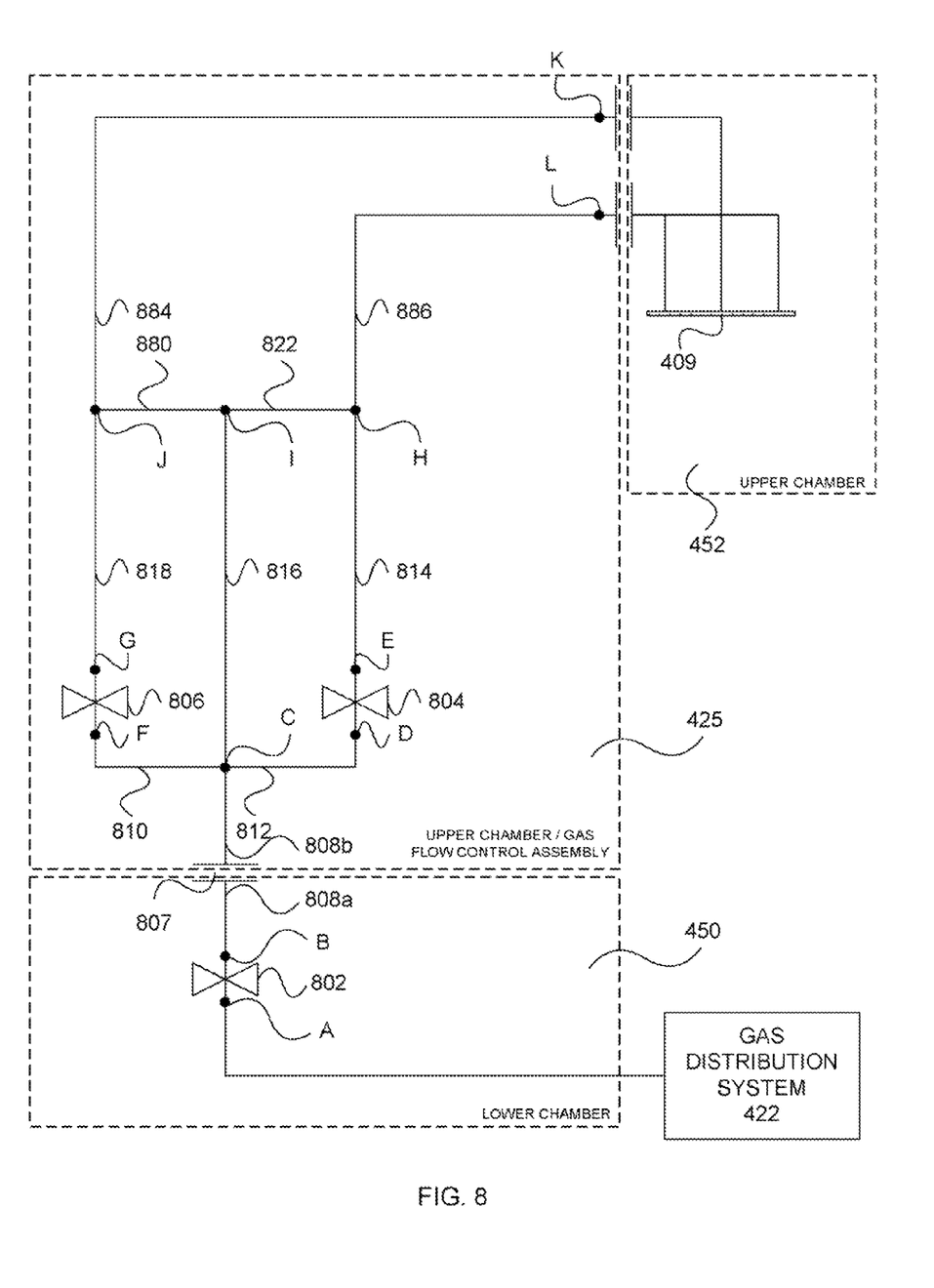
FIG. 8 shows a simplified diagram of a gas flow control assembly for a multi-zone showerhead/grounded electrode in a plasma processing system, according to one or more embodiments of the invention.

Referring now to FIG. 8, a simplified diagram of a gas flow control assembly 425 (as shown in FIG. 4) for a multi-zone showerhead/grounded electrode in a plasma processing system is shown, according to one or more embodiments of the invention. In an advantageous manner, the flow of a plasma gas may be individually adjusted between the center and the edge of the substrate. Generally, an appropriate set of gases is flowed into a plasma processing chamber (not shown) from gas distribution system 422 through gas flow control assembly 425 to showerhead/grounded electrode 409 located in the top piece 452. Showerhead/grounded electrode 409 may comprise a set of independently controlled nozzles, a first set in a center zone and a second set in a perimeter or edge zone. These plasma processing gases may be subsequently ionized to form a plasma (not shown), in order to process exposed areas of a substrate (not shown).

Gas distribution system 422 may be coupled at junction A to main shut off valve 802 located in the lower chamber, which may in turn be coupled via junction B through conduit 808a to lower-to-upper chamber interface 807. Lower-to-upper chamber interface 807 may allow top piece 450 (located in the upper chamber) to be safely removed from bottom piece 452 (located in the lower chamber) for cleaning and maintenance without damaging gas flow control assembly 425 and gas distribution system 422.

Lower-to-upper chamber interface 807 may be coupled to junction C that forks between a conduit 816, a bypass conduit 810 coupled to edge control valve 806 (second control valve 806) at junction F, and a bypass conduit 812 coupled to center control valve 804 (first control valve 804) at junction D. Conduit 816 is further coupled at junction I to restricted flow conduit 880 and restricted flow conduit 822.

If edge control valve 806 and center control valve 804 are both closed, the plasma gas flow to both zones of showerhead/grounded electrode 409 may be substantially restricted. Opening one of the valves may tend to increase the plasma gas flow to the corresponding zone, whereas opening both of the valves may tend to substantially equalize the plasma gas flow between both zones.

Edge control valve 806 may be coupled to variable flow conduit 818 at junction G, which may in turn be coupled to the previously mentioned restricted flow conduit 880 at junction J. Likewise, center control valve 804 may be coupled to variable flow conduit 814 at junction E, which may in turn be coupled to the previously mentioned restricted flow conduit 822 at junction H.

Edge conduit 884 may be coupled, at junction K, to showerhead/grounded electrode 409, while center conduit 886 may be coupled at, junction L, to showerhead/grounded electrode 409, which feed gases into the plasma processing chamber (not shown).

Benefits of the gas flow control assembly include the ability to asymmetrically distribute $O_2$ across the surface of the substrate to insure a substantially uniform etch rate.

As can be appreciated from the foregoing, embodiments of the present invention may improve uniformity in processing substrates, thereby advantageously increasing yield. Further, embodiments of the present invention may reduce cleaning requirements and frequencies for substrates and plasma processing chambers, thereby increasing productivity and reducing costs. Further, in one or more embodiments, more processing steps, such as PREB and barrier layer removal, may be performed in the same plasma processing chamber without transporting the substrates to a different plasma processing chamber. Accordingly, the frequency of transporting the substrates is reduced. As a result, the likelihood of substrate contamination may be substantially reduced, and the processing may be substantially simplified. Advantageously, the yield may be further increased, the productivity may be further increased, and the costs may be further reduced.

While this invention has been described in terms of several preferred embodiments, there are alterations, permutations, and equivalents which fall within the scope of this invention. For example, although the present invention has been described in connection with plasma processing systems from Lam Research Corp. (e.g., EXELAN™, EXELAN™ HP, EXELAN™ HPT, 2300 VERSYS™ STAR, etc.), other plasma processing systems may be utilized. This invention may also be utilized with substrates of various diameters (e.g., 200 mm, 300 mm, etc.). Also, photoresist plasma etchants comprising gases other than oxygen may be utilized. It should also be noted that there are many alternative ways of implementing the methods of the present invention. Furthermore, embodiments of the present invention may find utility in other applications. For example, although etching processes are discussed as examples, embodiments of the present invention may be applied in deposition processes. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for processing a substrate, the substrate including a barrier layer and a deposited photoresist element, the method comprising:

supplying and ionizing a first set of gases to partially etch the deposited photoresist element at a first portion of the substrate in a plasma processing chamber to result in a remaining portion of the deposited photoresist element;

supplying and ionizing a second set of gases to partially etch the deposited photoresist element at a second portion of the substrate in the plasma processing chamber to remove the remaining portion of the deposited photoresist element; and removing the barrier layer in the plasma processing chamber, wherein the first portion of the substrate represents a center zone of the substrate, the second portion of the substrate represent an edge zone of the substrate, the first set of gases and the second set of gases have the same composition, and the first set of gases and the second set of gases have different flow rates.

2. The method of claim 1 wherein the first set of gases and the second set of gases are simultaneously supplied into the plasma processing chamber.

3. The method of claim 1 further comprising controlling the first set of gases and the second set of gases such that the first set of gases and the second set of gases have different flow rates.

4. The method of claim 1 further comprising controlling a set of input gases to generate the first set of gases and the second set of gases.

5. The method of claim 1 wherein the first set of gases is supplied through a first set of nozzles, the second set of gases is supplied through a second set of nozzles, and at least one of the first set of nozzles and the second set of nozzles represents part of an electrode of the plasma processing system.

6. The method of claim 1 further comprising executing a waferless auto clean process.

7. The method of claim 1 wherein the deposited photoresist is deposited in at least one of a via feature and a trench feature of the substrate.

8. The method of claim 1 further comprising heating at least a portion of the plasma processing chamber to reduce an amount of contaminants that attach to the plasma processing chamber.

9. The method of claim 1 further comprising heating an electrode of the plasma processing system, the electrode configured to supply at least one of the first set of gases and the second set of gases.

10. The method of claim 1 further comprising supplying an inert gas to collide with plasma generated from at least one of the first set of gases and the second set of gases, thereby reducing a processing rate of the processing.

11. A method for processing a substrate in a plasma processing chamber in a plasma processing system, the method comprising:

injecting a first portion of a first set of gases into the plasma processing chamber through a first set of nozzles of a showerhead with a first flow rate, the first set of nozzles being positioned above a center zone of the substrate;

after the injecting the first portion of the first set of gases, injecting a second portion of the first set of gases into the plasma processing chamber through a second set of nozzles of the showerhead with a second flow rate, the first portion of the first set of gases and the second portion of the first set of gases having the same composition, the first flow rate being different from the second flow rate, the second set of nozzles being positioned above an edge zone of the substrate;

injecting a second set of gases into the plasma processing chamber;

exciting the first portion of the first set of gases into first plasma;

performing at least one of etching and deposition on the substrate utilizing the first plasma;

exciting the second portion of the first set of gases into second plasma;

after the performing, processing the substrate using the second plasma;

providing a temperature control system surrounding an electrode, the electrode representing the showerhead for delivering at least one of the first set of gases and the second set of gases into the plasma processing chamber; and heating the electrode using the temperature control system to increase collision between the first plasma and the second set of gases, thereby reducing a processing rate of the at least one of etching and deposition.

12. The method of claim 11 further comprising using the electrode to inject the first portion of the first set of gases though the first set of nozzles of the showerhead and the second set of gases through the second set of nozzles of the showerhead.

13. The method of claim 11 wherein the first set of gases includes oxygen.

14. The method of claim 11 wherein the second set of gases includes an inert gas.

15. The method of claim 11 further comprising heating at least a portion of the plasma processing chamber to reduce an amount of contaminants that attach to the plasma processing chamber.

* * * * *

UNITED STATES PATENT AND TRADEMARK OFFICE
CERTIFICATE OF CORRECTION

PATENT NO. : 7,662,723 B2
APPLICATION NO. : 11/608738
DATED : February 16, 2010
INVENTOR(S) : Guang-Yaw Hwang, Fu-Lun Lui and Yu-Wei Yang It is certified that error appears in the above-identified patent and that said Letters Patent is hereby corrected as shown below:

On the title page item (75), inventor Name is incorrectly spelled.
Please change "Pu-Lun Lui" to "Fu-Lun Lui"

Signed and Sealed this

Eleventh Day of May, 2010

David J. Kappos
*Director of the United States Patent and Trademark Office*